US009149905B2

(12) United States Patent
Itoyama et al.

(10) Patent No.: US 9,149,905 B2
(45) Date of Patent: Oct. 6, 2015

(54) POLISHING PAD AND METHOD FOR PRODUCING SAME

(71) Applicant: FUJIBO HOLDINGS, INC., Tokyo (JP)

(72) Inventors: Kouki Itoyama, Odawara (JP); Fumio Miyazawa, Gotemba (JP)

(73) Assignee: FUJIBO HOLDINGS, INC., Tokyo (JP)

( * ) Notice: Subject to any disclaimer, the term of this patent is extended or adjusted under 35 U.S.C. 154(b) by 0 days.

(21) Appl. No.: 14/349,856

(22) PCT Filed: Oct. 12, 2012

(86) PCT No.: PCT/JP2012/076441
§ 371 (c)(1),
(2) Date: Apr. 4, 2014

(87) PCT Pub. No.: WO2013/058183
PCT Pub. Date: Apr. 25, 2013

(65) Prior Publication Data
US 2014/0242894 A1 Aug. 28, 2014

(30) Foreign Application Priority Data

Oct. 18, 2011 (JP) .................. 2011-228987

(51) Int. Cl.
*B24D 7/16* (2006.01)
*B24B 37/24* (2012.01)
(Continued)

(52) U.S. Cl.
CPC ............ *B24B 37/24* (2013.01); *C08G 18/3814* (2013.01); *C08G 18/4854* (2013.01);
(Continued)

(58) Field of Classification Search
CPC ............ B24D 7/16; B24D 7/066; B24D 7/06; B24D 7/04; B24D 7/02; B24D 3/28; B24B 1/00; B24B 7/00; B24B 37/24; C08G 18/10; C08G 18/3206; C08G 18/3814; C08G 18/4854
USPC .......................... 451/41, 285–290, 526–539; 51/294–300
See application file for complete search history.

(56) References Cited

U.S. PATENT DOCUMENTS
4,397,799 A 8/1983 Edgren et al.
6,454,634 B1 * 9/2002 James et al. .................... 451/41
(Continued)

FOREIGN PATENT DOCUMENTS
JP 57-137323 A 8/1982
JP 10-006211 A 1/1998
(Continued)

OTHER PUBLICATIONS
International Search Report (PCT/ISA/210) mailed on Dec. 11, 2012, by the Japanese Patent Office as the International Searching Authority for International Application No. PCT/JP2012/076441.
(Continued)

*Primary Examiner* — George Nguyen
(74) *Attorney, Agent, or Firm* — Buchanan, Ingersoll & Rooney PC

(57) ABSTRACT

Provided are: a polishing pad which is capable of alleviating a scratch problem that occurs when a conventional hard (dry) polishing pad is used, and which is excellent in polishing rate and polishing uniformity and is usable not only for primary polishing but also for finish polishing; and a method for producing the polishing pad. The polishing pad is for polishing a semiconductor device and includes a polishing layer having a polyurethane-polyurea resin molded body containing cells of a substantially spherical shape. The polyurethane-polyurea resin molded body has a ratio of closed cells of 60 to 98%. The polyurethane-polyurea resin molded body has a ratio tan δ of a loss modulus E" to a storage modulus E' (loss modulus/storage modulus) of 0.15 to 0.30. The storage modulus E' is 1 to 100 MPa. The polyurethane-polyurea resin molded body has a density D of 0.4 to 0.8 g/cm³.

15 Claims, 2 Drawing Sheets

(51) Int. Cl.
*C08G 18/48* (2006.01)
*C08G 18/76* (2006.01)
*C08G 18/38* (2006.01)
*H01L 21/3105* (2006.01)
*C08G 101/00* (2006.01)

(52) U.S. Cl.
CPC ........ *C08G18/7621* (2013.01); *C08G 2101/00* (2013.01); *C08G 2101/0066* (2013.01); *C08K 2201/005* (2013.01); *H01L 21/31053* (2013.01)

(56) References Cited

U.S. PATENT DOCUMENTS

| | | | |
|---|---|---|---|
| 6,764,574 B1* | 7/2004 | Obeng et al. | 156/345.12 |
| 7,048,610 B1* | 5/2006 | Tregub et al. | 451/7 |
| 7,059,946 B1* | 6/2006 | Obeng et al. | 451/285 |
| 2002/0098789 A1* | 7/2002 | A. Burke | 451/526 |
| 2005/0064709 A1 | 3/2005 | Shimomura et al. | |
| 2005/0176912 A1 | 8/2005 | Shin et al. | |
| 2006/0060569 A1 | 3/2006 | Tano et al. | |
| 2006/0089093 A1 | 4/2006 | Swisher et al. | |
| 2006/0089094 A1 | 4/2006 | Swisher et al. | |
| 2006/0276109 A1* | 12/2006 | Roy et al. | 451/41 |
| 2006/0280929 A1 | 12/2006 | Shimomura et al. | |
| 2006/0280930 A1 | 12/2006 | Shimomura et al. | |
| 2008/0207100 A1* | 8/2008 | Roy et al. | 451/529 |
| 2009/0047872 A1* | 2/2009 | Fukuda et al. | 451/41 |
| 2009/0053976 A1* | 2/2009 | Roy et al. | 451/36 |
| 2009/0298392 A1* | 12/2009 | Okamoto et al. | 451/41 |
| 2010/0178853 A1* | 7/2010 | Oliver | 451/59 |
| 2011/0021123 A1 | 1/2011 | Kulp et al. | |
| 2011/0130077 A1* | 6/2011 | Litke et al. | 451/41 |
| 2011/0171890 A1* | 7/2011 | Nakayama et al. | 451/526 |
| 2012/0058712 A1* | 3/2012 | Oliver | 451/41 |

FOREIGN PATENT DOCUMENTS

| | | |
|---|---|---|
| JP | 2002-124491 A | 4/2002 |
| JP | 2004-001169 A | 1/2004 |
| JP | 2006-114885 A | 4/2006 |
| JP | 3788729 B2 | 6/2006 |
| JP | 3924952 B2 | 6/2007 |
| JP | 2007-238783 A | 9/2007 |
| JP | 3983610 B2 | 9/2007 |
| JP | 2008-207318 A | 9/2008 |
| JP | 4338150 B2 | 10/2009 |
| JP | 2009-256473 A | 11/2009 |
| JP | 2010-058194 A | 3/2010 |
| JP | 2010-082719 A | 4/2010 |
| JP | 2010-240777 A | 10/2010 |
| JP | 2011-040737 A | 2/2011 |

OTHER PUBLICATIONS

Written Opinion (PCT/ISA/237) mailed on Dec. 11, 2012, by the Japanese Patent Office as the International Searching Authority for International Application No. PCT/JP2012/076441.

Amemiya Akiko, "Characterization of Polyurethane Resin Using Pulse NMR and High Resolution Solid-State NMR," DIC Technical Review, 2006, pp. 7-12, No. 12.

Extended Search Report issued by the European Patent Office in corresponding European Application No. 12841356 on Jun. 18, 2015 (7 pages).

* cited by examiner

POLISHING PAD AND METHOD FOR PRODUCING SAME

TECHNICAL FIELD

The present invention relates to a polishing pad and a method for producing the same. The present invention particularly relates to a CMP polishing pad for semiconductor devices and a method for producing the polishing pad.

BACKGROUND ART

Surfaces of materials of silicon, hard disks, mother glasses for liquid-crystal displays, semiconductor devices, and so forth need to be flat, and accordingly are polished by a loose abrasive process using a polishing pad. The loose abrasive process is a method for polishing a work surface of a workpiece, while supplying a slurry (polishing liquid) containing abrasive grains between the polishing pad and the non-polished object.

As for a polishing pad for semiconductor devices, the surface of the polishing pad is required to have: opened pores for retaining abrasive grains; a hardness for keeping the flatness of the surfaces of the semiconductor devices; and an elasticity for preventing a scratch on the surfaces of the semiconductor devices. As polishing pads that meet these requirements, there have been utilized polishing pads which have a polishing layer produced from a urethane resin foam.

The urethane resin foam is generally molded by curing a prepolymer containing a polyurethane bond-containing isocyanate compound through a reaction with a curing agent (dry method). Then, the foam is sliced into a sheet shape, and thus a polishing pad is formed. In the case of a polishing pad having a hard polishing layer molded by the dry method as described above (hereinafter, sometimes abbreviated as a hard (dry) polishing pad), relatively small cells of a substantially spherical shape are formed inside the foam during the curing and molding of the urethane resin. Hence, on the polishing surface of the polishing pad formed by the slicing, opened pores (openings) are formed, which can retain a slurry during polishing.

Conventional mainstream urethane resin foams serving as a material of polishing pads for semiconductor devices have a cell diameter of 100 μm or less, and mostly have around 30 μm (Patent Literature 1). Moreover, the mainstream urethane resin foams have an A hardness of 70 degrees or more, a D hardness of 45 degrees or more (Patent Literatures 2 and 3), and a density is 0.5 g/cm$^3$ or more (Patent Literature 1). As to the elasticity, the storage modulus is mainly several hundreds of MPa or more (Patent Literature 4). The modulus of longitudinal elasticity (Young's modulus) is mainly 500 MPa or more (Patent Literature 5).

Moreover, other than the above mainstream urethane resin foams, urethane resin foams have been improved in physical properties from the viewpoints of bulk density, A hardness, and hard segment content (HSC) (%) in order to optimize the degree of wearing and to stabilize the polishing performance (Patent Literature 6). Further, there are also reports on polishing pads, which are adjusted to have a storage modulus within a predetermined range in order to reduce occurrence of a scratch (Patent Literatures 7, 8).

In addition, there is a report on a polishing pad, which is improved in the A hardness and the modulus of compression elasticity by having a phase-separated structure made clear by: obtaining component amounts of a crystalline phase (L), an interface phase (M), and an amorphous phase (S) and the spin-spin relaxation times (T2) thereof from free induction decay signals (FID) in pulsed NMR; and then optimizing the T2 and the component amount of M (Patent Literature 9). Further, there is a report that, by adjusting a ratio of a hard segment present in a foamed polyurethane in pulsed NMR measurement to 55 to 70%, a polishing pad is made to exhibit properties such as being hard as well as being easily broken under tension with little elongation and has an enhanced dressing property while maintaining the high hardness (Patent Literature 10).

CITATION LIST

Patent Literatures

Patent Literature 1: Japanese Patent No. 4338150
Patent Literature 2: Japanese Patent No. 3924952
Patent Literature 3: Japanese Patent No. 3788729
Patent Literature 4: Japanese Patent No. 3983610
Patent Literature 5: Japanese Patent Application Publication No. Hei 10-6211
Patent Literature 6: Japanese Patent Application Publication No. 2010-58194
Patent Literature 7: Japanese Patent Application Publication No. 2006-114885
Patent Literature 8: Japanese Patent Application Publication No. 2009-256473
Patent Literature 9: Japanese Patent Application Publication No. 2010-82719
Patent Literature 10: Japanese Patent Application Publication No. 2010-240777

SUMMARY OF INVENTION

Technical Problems

However, the aforementioned dry polishing pads are still hard, and tend to apply a pressure locally to a workpiece. For these reasons, the polishing pads are not satisfactory in terms of reduction in a polishing defect (scratch) that occurs on the surface of a workpiece. Additionally, the polishing pads still have a problem of high possibility of clogging. Accordingly, usually, after polishing with these hard polishing pads molded by the dry method (primary polishing), finish polishing has to be further performed using a polishing pad having a soft polishing layer molded by a wet method.

In the wet method, a resin is dissolved into a water-miscible organic solvent; the resin solution is applied to a sheet-shaped base material for film formation; and then, the resin is coagulated and regenerated in an aqueous coagulating liquid. A polishing pad having a soft polishing layer molded by the wet method has a low hardness and large suede-type opened pores, and the foam structure is not uniform. Hence, the polishing rate and the polishing uniformity (degree of asperity on the surface of a workpiece after the polishing) are superior to those by polishing with a polishing pad having a hard polishing layer molded by the dry method. However, the cell shape is anisotropic, so that the state of openings on the surface may be changed by wearing, or a low density portion at a lower portion of the polishing layer may be torn off. There is a problem that the polished state cannot be kept at a certain level for a long period.

Thus, there is a demand for a polishing pad usable also for finish polishing, while taking advantages of a polishing pad having a polishing layer molded by the dry method.

The present invention has been made in view of the above-described problems. An object of the present invention is to provide: a polishing pad capable of alleviating a scratch problem that occurs when a conventional hard (dry) polishing pad is used, the polishing pad being excellent in polishing rate and polishing uniformity and usable not only for primary polishing but also for finish polishing; and a method for producing the polishing pad.

Solution to Problems

In order to achieve the above object, the present invention adopts the following configurations.

1. A polishing pad for polishing a semiconductor device, the polishing pad comprising a polishing layer having a polyurethane-polyurea resin molded body containing cells of a substantially spherical shape, wherein
the polyurethane-polyurea resin molded body has a ratio of closed cells of 60 to 98%,
the polyurethane-polyurea resin molded body has a ratio tan δ of a loss modulus E" to a storage modulus E' (loss modulus/storage modulus) of 0.15 to 0.30 at 40° C. with an initial load of 10 g, a strain range of 0.01 to 4%, and a measurement frequency of 0.2 Hz in a tensile mode,
the storage modulus E' is 1 to 100 MPa, and
the polyurethane-polyurea resin molded body has a density D of 0.4 to 0.8 g/cm$^3$.

2. The polishing pad according to 1, wherein, provided that a free induction decay signal (FID) of the polyurethane-polyurea resin molded body obtained by pulsed NMR is subjected to waveform separation by sequentially subtracting components in descending order of spin-spin relaxation time T2 based on a least-squares method, and thus divided into three components of L (amorphous phase), M (interface phase), and S (crystalline phase) in descending order of spin-spin relaxation time T2, the M component has spin-spin relaxation time $T2_M$ of 180 to 300 μs.

3. The polishing pad according to 2, wherein a component ratio $C_M$ of the M component present in the polyurethane-polyurea resin molded body is within a range of 60 to 90 mass %.

4. The polishing pad according to 2 or 3, wherein an X value obtained by $X=T2_M/D$ is within a range of 210 to 580, wherein
$T2_M$ represents the spin-spin relaxation time of the M component, and
D represents the density.

5. The polishing pad according to any one of 1 to 4, wherein the polyurethane-polyurea resin molded body has an average cell diameter of 10 to 50 μm.

6. The polishing pad according to any one of 1 to 5, wherein the polyurethane-polyurea resin molded body has an A hardness of 20 to 70 degrees.

7. The polishing pad according to any one of 1 to 6, wherein the polyurethane-polyurea resin molded body has a thickness of 0.5 to 1.5 mm.

8. The polishing pad according to any one of 1 to 7, wherein a layer harder than the polishing layer is pasted to a surface of the polishing layer on a side opposite to a polishing surface thereof.

9. The polishing pad according to any one of 1 to 8, wherein the cells are formed by hollow portions of hollow microspheres.

10. A method for producing the polishing pad according to any one of 1 to 9, the method comprising:
a providing step of providing at least a polyurethane bond-containing isocyanate compound (A), a polyamine compound (D), and hollow microspheres (E);
a mixing step of mixing at least the polyurethane bond-containing isocyanate compound (A), the polyamine compound (D), and the hollow microspheres (E) to obtain a liquid mixture for molded-body molding;
a molded-body molding step of molding a polyurethane-polyurea resin molded body from the liquid mixture for molded-body molding; and
a polishing-layer forming step of forming a polishing layer having a polishing surface for polishing a workpiece from the polyurethane-polyurea resin molded body.

11. The method for producing the polishing pad according to 10, the method further comprising a step of reacting a polyisocyanate compound (B) with a first polyol compound (C-1) to obtain the polyurethane bond-containing isocyanate compound (A).

12. The method for producing the polishing pad according to 11, the method comprising:
further providing a second polyol compound (C-2); and
mixing the second polyol compound (C-2) with the polyurethane bond-containing isocyanate compound (A), the polyamine compound (D), and the hollow microspheres (E) in the mixing step.

13. The method for producing the polishing pad according to 12, wherein, in the providing step, the materials are provided such that an equivalence ratio of amino groups of the polyamine compound (D) to a sum of equivalents of the amino groups of the polyamine compound (D) and hydroxyl groups of the second polyol compound (C-2) (the equivalent of active hydrogen groups) is 0.70 to 0.97 (the amino groups/(the amino groups+the hydroxyl groups)).

14. The method for producing the polishing pad according to 10 to 13, wherein the polyamine compound (D) is
methylene-bis-o-chloroaniline (MOCA), or
crude MOCA that is a mixture of monomer and multimers of methylene-bis-o-chloroaniline (MOCA), wherein the crude MOCA contains the multimers in a quantity of 15 mass % or more.

15. The method for producing the polishing pad according to any one of 12 to 14, wherein the second polyol compound (C-2) is polytetramethylene glycol or polypropylene glycol having a number average molecular weight of 500 to 5000, or a mixture thereof.

Advantageous Effects of Invention

Although the polishing pad of the present invention is a soft pad with a low storage modulus, the proportion of closed cells is high. This suppresses permeation of a slurry and a sludge into the pad, and a scratch due to aggregation and solidification of the abrasive grains and the sludge hardly occurs. Moreover, since the tan δ is relatively high, the polishing pad has a delayed elasticity appropriately. This suppresses excessive pressing and excessive following to recesses or protrusions of a workpiece. As a result, a scratch hardly occurs, and the polishing rate is also improved. Furthermore, the polishing pad of the present invention is excellent also in polishing uniformity. Thus, despite being molded by the dry method, the polishing pad is advantageously usable for primary polishing as well as finish polishing.

DESCRIPTION OF EMBODIMENTS

Figure 1:
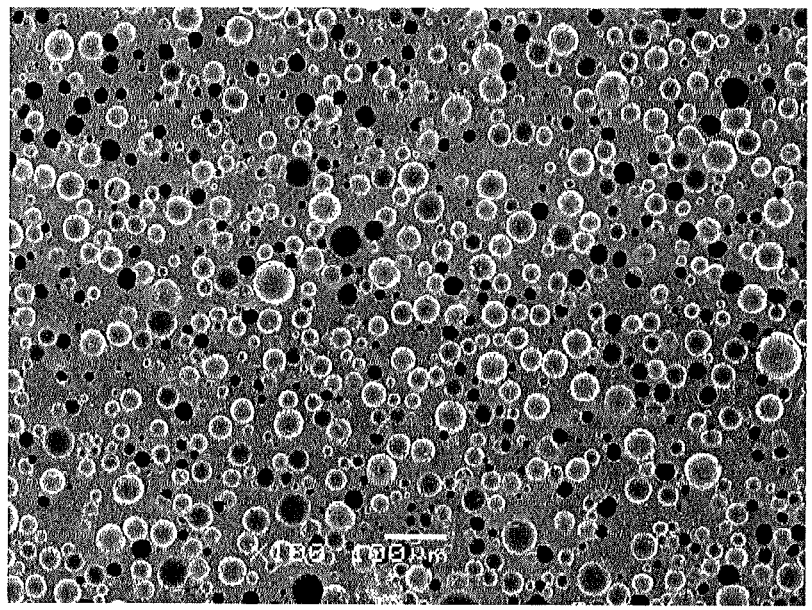
FIG. 1 is a sectional photograph of a polishing pad for illustrating an embodiment of the present invention.

Hereinafter, modes for carrying out the present invention will be described.

<<Polishing Pad>>

A polishing pad of the present invention includes a polishing layer having a polyurethane-polyurea resin molded body containing cells of a substantially spherical shape. The polishing pad is characterized as follows. The polyurethane-polyurea resin molded body has a ratio of closed cells of 60 to 98%. The polyurethane-polyurea resin molded body has a ratio tan δ of a loss modulus E" to a storage modulus E' (loss modulus/storage modulus) of 0.15 to 0.30 at 40° C. with an initial load of 10 g, a strain range of 0.01 to 4%, and a measurement frequency of 0.2 Hz in a tensile mode. The storage modulus E' is 1 to 100 MPa. The polyurethane-polyurea resin molded body has a density D of 0.4 to 0.8 g/cm$^3$.

The polyurethane-polyurea resin molded body means a resin molded body having at least two or more urethane bonds and at least two or more urea bonds in its molecule. The polyurethane-polyurea resin molded body of the present invention can be produced, for example, using an polyurethane bond-containing isocyanate compound formed by reacting a polyisocyanate compound with a polyol compound, a polyamine compound, and hollow microspheres.

Moreover, the substantially spherical shape is a concept meaning a cell shape (isotropic spherical, elliptic, or other shapes similar to these) normally present in a molded body molded by the dry method (see FIG. 1), and is clearly distinguished from cells contained in a molded body molded by the wet method (the cells are anisotropic and have a structure in which the diameter increases from the surface of a polishing layer of a polishing pad to the bottom portion thereof).

(Ratio of Closed Cells)

In Description and Claims, the ratio of closed cells means a ratio of the volume of closed cells alone to the entire cell volume in a specimen.

The ratio of closed cells is measured by introducing by pressure a gas into a molded body having cells therein (foam), and measuring the volume of portions having the gas introduced therein (volume of open cell (also referred to as open foam) portions) and the volume of portions not having the gas introduced therein (volume of closed cell portions) for calculation according to "the volume of closed cell portions in the molded body/(the volume of closed cell portions in the molded body+the volume of open cell portions in the molded body)." The ratio of closed cells can be measured according to ASTM D2856.

Moreover, in the above, the closed cell refers to a cell completely surrounded by walls (not connected to the other cells), and the open cell (also referred to as open foam) refers to a cell not completely surrounded by walls (the cell and other cells or the outside are connected to each other).

In the polishing pad of the present invention, the polyurethane-polyurea resin molded body has a ratio of closed cells of 60 to 98 volume %, preferably 80 to 98 volume %, more preferably 90 to 98 volume %.

When the ratio of closed cells is within the above-described range, this suppresses permeation of a slurry, and a sludge into the pad, and a scratch due to aggregation and solidification of the abrasive grains and the sludge can be prevented from occurring.

(Storage Modulus E' and Loss Modulus E")

In Description and Claims, the storage modulus is an index of energy stored and completely recovered per cycle when sinusoidally-changing stress is applied to a foam.

In Description and Claims, the loss modulus means a size of a stress component whose phase is moved by π/2 by a strain when a sinusoidal strain is applied at a characteristic oscillation frequency.

The storage modulus E' and the loss modulus E" are a storage modulus E' and loss modulus E" at 40° C. with an initial load of 10 g, a strain range of 0.01 to 4%, and a measurement frequency of 0.2 Hz according to JIS K7244-4, and may be abbreviated as $E'_{40}$ and $E''_{40}$, respectively.

The polyurethane-polyurea resin molded body has a storage modulus E' of 1 to 100 MPa, preferably 10 to 100 MPa, more preferably 20 to 100 MPa, at 40° C. with an initial load of 10 g, a strain range of 0.01 to 4%, and a measurement frequency of 0.2 Hz in a tensile mode. If the storage modulus E' is less than the above-described range, the pad itself is likely to be deformed by a biased load and so forth temporarily applied during polishing, and the polishing uniformity is deteriorated. On the other hand, if the storage modulus E' is more than the above-described range, a scratch is likely to occur due to a lack of elasticity (flexibility).

(Tan δ)

In the polishing pad of the present invention, the polyurethane resin molded body constituting the polishing pad has a ratio (tan δ) of the loss modulus E" to the storage modulus E' (loss modulus E"/storage modulus E') of preferably 0.15 to 0.30, more preferably 0.15 to 0.25, and further preferably 0.15 to 0.20, at 40° C. with an initial load of 10 g, a strain range of 0.01 to 4%, and a measurement frequency of 0.2 Hz in a tensile mode.

When the tan δ is within the above-described range, the the elasticity is appropriately delayed. This suppresses excessive pressing and excessive following to recesses or protrusions of a workpiece, so that a scratch hardly occurs, and further that the polishing rate is also improved.

(Density D)

The polyurethane-polyurea resin molded body has a density D of 0.40 to 0.80 g/cm$^3$, more preferably 0.50 to 0.80 g/cm$^3$. When the density D is within the range, this hardly causes a cut due to clogging of the surface of the polishing layer with an abrasive, removed chips from a workpiece, and the like. In contrast, if the density D is less than the lower limit, the elasticity is extremely increased. Accordingly, the pad itself is greatly deformed when brought into contact with a workpiece, and the planarization performance is deteriorated. On the other hand, if the density D is more than the upper limit, a scratch is likely to occur due to a lack of elasticity (flexibility).

Particularly, in the present invention, all of the ratio of closed cells, the storage modulus E', the tan δ, and the density D are restricted to the above-described numerical ranges. Thus, a polishing pad favorable for all of scratch suppression, polishing rate, and polishing uniformity can be obtained.

(Pulsed NMR)

In pulsed NMR measurement, a pulsed NMR spectrometer (manufactured by JEOL Ltd., JNM-MU25, 25 MHz) is used. The measurement is performed by a solid echo method with a 90° pulse of 2.0 μs, repetition time: 4 s, number of scans: 8, and a temperature: 40° C.

Since the solid echo method has been already well known, the detailed description is omitted. The method is employed mainly for measurement of a specimen having short relaxation time such as glass-like and crystalline polymers. This method is performed as if dead time is eliminated, and is a 90° x-τ-90° y pulse method, in which two 90° pulses are applied with a phase change of 90°. When a 90° pulse is applied in an X-axis direction, a free induction decay (FID) signal is observed after dead time. If the second 90° pulse is applied in a y-axis direction at time τ where the FID signal has not decayed, the orientations of magnetization are aligned with each other at time t=2τ, and thereby an echo is produced. The obtained echo can be approximated as an FID signal after a 90° pulse.

The method for analyzing the relation among the physical properties, the phase-separated structure, and the composition from an analysis result of pulsed NMR has been already well known. When the free induction decay (FID) signal obtained by pulsed NMR is subjected to waveform separation by sequentially subtracting components in descending order of spin-spin relaxation time T2 based on a least-squares method, the FID signal can be divided into three components. A component having long relaxation time is a component having a high mobility and is defined as an amorphous phase; a short component is a component having a low mobility and is defined as a crystalline phase; and an intermediate component is defined as an interface phase (if it is difficult to separate the interface phase and the amorphous phase from each other, analyzed as the interface phase). A component amount of each component is obtained using an equation based on a Gaussian function and a Lorentzian function (for example, "Characterization of Polyurethane Resin Using Pulse NMR and High Resolution Solid-State NMR" (see DIC Technical Review N. 12, pp. 7 to 12, 2006)).

Figure 2:
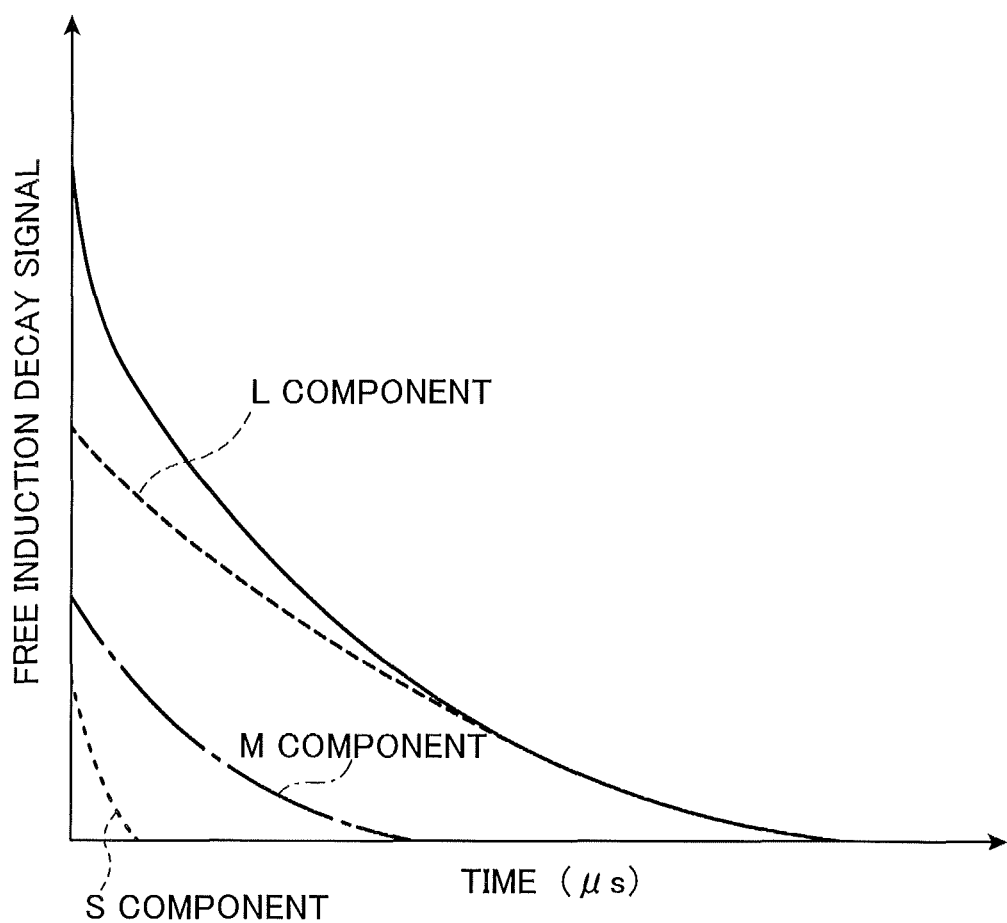
FIG. 2 is a graph schematically showing a time-free induction decay signal curve obtained by measuring a polyurethane resin by pulsed nuclear magnetic resonance, and curves obtained by waveform separation of the curve into an amorphous phase (L component), an interface phase (M component), and a crystalline phase (S component) based on the difference in spin-spin relaxation time by using a least-squares method.

The pulsed NMR measurement is described in detail as follows. First, a 1-cm diameter glass tube is loaded with a specimen, which consists of samples cut to approximately 1- to 2-ram square, to a height of 1 to 2 cm. The glass tube is placed in a magnetic field, to which a high-frequency pulsed magnetic field is applied. Then, the relaxation behavior of a macroscopic magnetization is measured, and a free induction decay (FID) signal as shown in FIG. 2 is obtained (horizontal axis: time (μs), vertical axis: free induction decay signal) The initial value of the obtained FID signal is proportional to the number of protons in a measurement specimen. In a case where the measurement specimen has three components, the FID signal exists as the sum of response signals of the three components. Meanwhile, since components contained in a specimen differ from each other in mobility, the decay speed of the response signals differs among the components, and the spin-spin relaxation Lime T2 is different from the others. For this reason, the FID signal can be divided by the least-squares method into three components: an amorphous phase (L component), an interface phase (M component), and a crystalline phase (S component) in descending order of spin-spin relaxation time T2 (see FIG. 2). The amorphous phase is a component having a high molecular mobility; the crystalline phase is a component having a low molecular mobility; and an intermediate component is the interface phase.

For the above-described pulsed NMR, solid echo method, and spin-spin relaxation Lime T2, reference can be made to Japanese Patent Application Publication No. 2007-238783 (particularly, paragraphs [0028] to [0033]).

The "spin-spin relaxation time (T2)" is used as an index of molecular mobility, and a larger numerical value indicates a higher mobility. Generally, since a crystalline phase has a low mobility, the T2 thereof is short. In contrast, an amorphous phase has a longer T2. The higher the molecular weight of a diol, the higher the mobility, so that the T2 value is increased.

The reason why the spin-spin relaxation time T2 is indicative of molecular mobility is understood from the relationship between the T2 and correlation time τc of molecular motion. τc represents average time of molecular collisions by molecules in certain motional states. It is known that as TC increases, a T2 value is decreased in a inversely proportional manner. This indicates that as a molecular mobility is lowered, the T2 is shortened.

The "component amount (phase amount)" refers to a percentage (mass %) of each phase. The shorter the T2 of the amorphous phase, or the lower the proportion of the amorphous phase, the harder the urethane becomes. Moreover, the lower the percentage of the interface phase, the more clearly the phases of the crystalline phase and the amorphous phase are separated in the structure, so that the structure has an elasticity causing less strain. In contrast, the higher the percentage of the interface phase, the less clearly the phases of the crystalline phase and the amorphous phase are separated in the structure, and a delayed elasticity is exhibited.

(Spin-Spin Relaxation Time $T2_M$)

When a free induction decay signal (FID) of the polyurethane-polyurea resin molded body of the present invention obtained by pulsed NMR is subjected to waveform separation by sequentially subtracting components in descending order of spin-spin relaxation time T2 based on a least-squares method, and thus divided into three components of L (amorphous phase), M (interface phase), and S (crystalline phase) in descending order of the spin-spin relaxation time T2 (if it is difficult to separate the M component and the L component from each other, the total of the M component and the L component is regarded as the M component), the M component has spin-spin relaxation time T2 (hereinafter, may be expressed as $T2_M$) of preferably 180 to 300 μs, more preferably 180 to 270 μs, and further preferably 180 to 260 μs. If the $T2_M$ is less than the above-described range, there are trends that the polishing rate is deteriorated, and further that the polishing uniformity is also lowered. On the other hand, if the $T2_M$ is more than the above-described range, an appropriate dressing property is not obtained, and a scratch occurs due to clogging at opening portions.

In the above, the phrase "difficult to separate the M component and the L component from each other" refers to a case where components cannot be separated into three during the dividing in the descending order of T2. This is because the present invention is a soft urethane, and the proportion of the amorphous phase is originally so high that the interface phase behaves similarly to the amorphous phase. Nevertheless, since an interface phase is never absent, such a component is regarded as an interface phase but not as the amorphous phase.

(Component Amount ($C_M$) of M Component)

In addition to the above, the component amount ($C_M$) of the M component is preferably within a range of 60 to 90% (mass %), more preferably 60 to 80%.

When the component amount of the M component is within the above-described range, a region (M component) where molecules are associated with each other by appropriate cohesive force is contained in an appropriate amount. Accordingly, the dressing property becomes appropriate, a scratch due to clogging of opening portions is suppressed, and the polishing uniformity is also maintained at the same time. The smaller the M component, the less a strain occurs, so that the rubber elasticity is excellent. Meanwhile, in terms of polishing properties, a polishing rate is hardly obtained because the response of the stress against compressions by the polishing pressure is too high (too fast). On the other hand, if the M component is too large, the polishing uniformity is poor because the response of the stress against compressions is too low (too slow). In contrast, when the M component is within the above-described range, polishing excellent in both polishing rate and polishing uniformity is possible because of an appropriate delayed elasticity.

(X Value)

Moreover, in addition to the above, it has been found out as a result of intensive studies that if an X value obtained by $X=T2_M/D$ is within a range of 210 to 580, this makes it possible to secure scratch suppression, polishing rate, and polishing uniformity while maintaining certain polishing flatness. Here, $T2_M$ means the spin-spin relaxation time (μs) of the M component, and D means the density (g/cm$^3$).

The X value is preferably within a range of 210 to 580, more preferably within a range of 240 to 480.

Here, the polishing pad constituted of a polyurethane-based resin having appropriate urea bonds is likely to satisfy the above X value, and excellent polishing properties are obtained. Accordingly, the X value presumably means an index of appropriate softening of a polishing surface in a wet state by the urea bonds and so forth (since this range results in a urethane-resin resin composition having urea bonds appropriately, the resin composition is appropriately softened in a wet state). Thus, a localized load is less likely to be applied to semiconductor wafers, so that desirable functions and effects are exhibited.

(Average Cell Diameter d)

In Description and Claims, the average cell diameter refers to an average value of equivalent circle diameters calculated from areas and the number of cell portions obtained by binarizing an image of the surface of the polishing pad (note that the numerical value is obtained when the "cutoff value" for cutting noise was set to 10 μm in the image processing).

The polyurethane-polyurea resin molded body of the polishing layer has an average cell diameter d (μm) of preferably 10 to 50 μm, more preferably 20 to 40 μm. If the average cell diameter (μm) is not less than the upper limit, the surface of the polishing layer tends to be rough, deteriorating the polished quality of a workpiece. If the average cell diameter (μm) is not more than the lower limit, the surface of the polishing layer is likely to be clogged, and the surface of the polishing layer loses flexibility, so that a scratch is likely to occur.

Moreover, in the polishing pad of the present invention, the cells in the polyurethane resin molded body are preferably formed by hollow microspheres (also referred to as thermally expandable microcapsules). By use of the hollow microspheres, opened pores derived from the hollow microspheres are formed on the polishing surface; furthermore, a slurry supplied during the polishing is retained on the opened pores, and moves substantially uniformly on a work surface of a workpiece, thereby contributing to the polishing, in other words, the slurry is uniformly dispersed and supplied. Hence, effects such as being capable of stabilizing the polishing properties such as polishing efficiency and polishing accuracy are demonstrated.

Usable hollow microspheres will be exemplified in the description of the method for producing a polishing pad.

(A Hardness)

In Description and Claims, the A hardness means a value measured according to JIS K7311.

The polyurethane-polyurea resin molded body has an A hardness of preferably 20 to 70 degrees, more preferably 30 to 70 degrees, and further preferably 40 to 70 degrees.

If the A hardness is loss than the above-described range, the elasticity is extremely increased. Accordingly, the pad itself is greatly deformed when brought into contact with a workpiece, and the planarization performance is deteriorated. On the other hand, if the A hardness is more than the above-described range, a scratch is likely to occur due to a lack of elasticity (flexibility).

(Thickness)

In the polishing pad of the present invention, the thickness of the polyurethane-polyurea resin molded body is not particularly limited, but is preferably approximately 0.5 to 1.5 mm.

The polishing pad of the present invention can be suitably used for polishing silicon, hard disks, mother glasses for liquid-crystal displays, and semiconductor devices, particularly chemical mechanical polishing (CMP) for semiconductor devices.

<<Method for Producing Polishing Pad>>

A method for producing a polishing pad for polishing a semiconductor device of the present invention makes it possible to produce the polishing pad for polishing a semiconductor device of the present invention, and is characterized by including: a providing step of providing at least a polyurethane bond-containing isocyanate compound (A), a polyamine compound (D), and hollow microspheres (E); a mixing step of mixing at least the polyurethane bond-containing isocyanate compound (A), Lie polyamine compound (D), and the hollow microspheres (E) obtain a liquid mixture for molded-body molding; a molded-body molding step of molding a polyurethane-polyurea resin molded body from the liquid mixture for molded-body molding; and a polishing-layer forming sLep of forming a polishing layer having a polishing surface for polishing a workpiece from the polyurethane-polyurea resin molded body.

Hereinafter, the providing step, the mixing step, the molded-body molding step, and the polishing-layer forming step will be described separately.

<Providing Step>

For producing the polishing pad of the present invention, at least a polyurethane bond-containing isocyanate compound (A), a polyamine compound (D), and hollow microspheres (E) are used as raw materials of the polyurethane-polyurea resin molded body. Further, a polyol compound (C-2) may be used together with the above components.

Additionally, other components than the above may be used in combination, as long as the effects of the present invention are not impaired.

Hereinafter, each component will be described.

[(A) Polyurethane Bond-Containing Isocyanate Compound]

The polyurethane bond-containing isocyanate compound (A) (hereinafter, may be called component (A)), which is a compound obtained by reacting a polyisocyanate compound (B) and a polyol compound (C-1), which will be described below, under conditions normally employed. The compound contains a polyurethane bond and an isocyanate group in its molecule. Moreover, the polyurethane bond-containing isocyanate compound may contain other components, as long as the effects of the present invention are not impaired.

The polyurethane bond-containing isocyanate compound (A) to be used may be a commercially available compound, or a compound synthesized by reacting a polyisocyanate compound with a polyol compound. The reaction is not particularly limited, and it is only necessary that an addition polymerization reaction take place by employing known methods and conditions for producing a polyurethane resin. The polyurethane bond-containing isocyanate compound (A) can be produced, for example, by a method in which a polyisocyanate compound heated to 50° C. is added to a polyol compound heated to 40° C., while being stirred in a nitrogen atmosphere, the temperature is raised to 80° C. 30 minutes, and the reaction is allowed to further proceed at 80° C. for 60 minutes.

The mass average molecular weight of the polyurethane bond-containing isocyanate compound (A) is not particularly limited, but is preferably 500 to 2000, more preferably 1000 to 1500.

Further, in producing the polyurethane bond-containing isocyanate compound (A), normally, the polyisocyanate compound is excessively added to the polyol compound. Accordingly, the polyisocyanate compound remains in the reaction solution even after the polyurethane bond-containing isocyanate compound is formed. In this case, the reaction solution is directly used in the subsequent mixing step so that the polyisocyanate compound (B) contained in the reaction solution may be utilized for molding the polyurethane-polyurea resin. Alternatively, it is also possible to provide a different polyisocyanate compound (B) from the one used for synthesizing the polyurethane bond-containing isocyanate compound, and to mix this with the other components in the mixing step.

[(B) Polyisocyanate Compound]

In Description and Claims, the polyisocyanate compound means a compound having two or more isocyanate groups in its molecule.

The polyisocyanate compound (B) (hereinafter, may be called component (B)) is not particularly limited, as long as the compound has two or more isocyanate groups in its molecule. Examples of a diisocyanate compound having two isocyanate groups in its molecule include m-phenylene diisocyanate, p-phenylene diisocyanate, 2,6-tolylene diisocyanate (2,6-TDI), 2,4-tolylene diisocyanate (2,4-TDI), naphthalene-1,4-diisocyanate, diphenylmethane-4,4'-diisocyanate (MDI), 4,4'-methylene-bis(cyclohexyl isocyanate) (hydrogenated MDI), 3,3'-dimethoxy-4,4'-biphenyl diisocyanate, 3,3'-dimethyldiphenylmethane-4,4'-diisocyanate, xylylene-1,4-diisocyanate, 4,4'-diphenylpropane diisocyanate, trimethylene diisocyanate, hexamethylene diisocyanate, propylene-1,2-diisocyanate, butylene-1,2-diisocyanate, cyclohexylene-1,2-diisocyanate, cyclohexylene-1,4-diisocyanate, p-phenylene diisothiocyanate, xylylene-1,4-diisothiocyanate, ethylidyne diisothiocyanate, and the like.

The polyisocyanate compound is preferably a diisocyanate compound. Above all, 2,4-TDI, 2,6-TDI, and MDI are more preferable, and 2,4-TDI and 2,6-TDI are particularly preferable.

These polyisocyanate compounds may be used alone, or multiple polyisocyanate compounds may be used in combination.

[(C) Polyol Compound]

In Description and Claims, the polyol compound means a compound having two or more alcoholic hydroxyl groups (OH) in its molecule.

((C-1) First Polyol Compound)

The polyol compound (C-1) (first polyol compound (C-1)) (hereinafter, may be called component (C-1)) used for synthesizing the polyurethane bond-containing isocyanate compound, which is the prepolymer, includes diol compounds and triol compounds such as ethylene glycol and butylene glycol; polyether-polyol compounds such as polytetramethylene glycol (PTMG); polyester-polyol compounds such as a reactant of ethylene glycol with adipic acid and a reactant of butylene glycol with adipic acid; polycarbonate-polyol compounds; polycaprolactone-polyol compounds; and the like. Among these, PTMG is preferable, PTMG having a number average molecular weight (Mn) of approximately 500 to 5000 is further preferable, and PTMG of approximately 1000 is most preferable.

The first polyol compounds (C-1) may be used alone, or multiple polyol compounds may be used in combination.

Meanwhile, an NCO equivalent of the prepolymer obtained by "((parts by) mass of the polyisocyanate compound+(parts by) mass of the first polyol compound (C-1))/ [(the number of functional groups per molecule of the polyisocyanate compound×(parts by) mass of the polyisocyanate compound/the molecular weight of the polyisocyanate compound)−(the number of functional groups per molecule of the first polyol compound (C-1)×(parts by) mass of the first polyol compound (C-1)/the molecular weight of the first polyol compound (C-1))]" is a numerical value indicating a molecular weight of the PP (prepolymer) per NCO group. The NCO equivalent is preferably approximately 400 to approximately 650.

((C-2) Second Polyol Compound)

Additionally, in the present invention, independently from the polyol compound (C-1) used for forming the polyurethane bond-containing isocyanate compound, which is the prepolymer, a polyol compound (C-2) (second polyol compound (C-2)) (hereinafter, may be called component (C-2)) may be added into a mixer and mixed with the polyurethane bond-containing isocyanate compound (A), the polyamine compound (D), and the hollow microspheres (E), and so forth. The second polyol compound (C-2) itself may be prepared alone, or may be prepared as a liquid mixture with the polyamine compound (D). The polyol compound (C-2) acts as a curing agent for curing the prepolymer, and incorporating the polyol compound (C-2) by a competitive reaction with the polyamine compound (D) suppresses uneven chain extension reaction of the polyamine compound (D) among the blocks, facilitating a polymerization with less uneven degrees of polymerization.

As the second polyol compound (C-2), compounds such as diol compounds and triol compounds can be used without particular limitations. Moreover, the second polyol compound (C-2) may be the same as or different from the first polyol compound (C-1).

Specific examples thereof include low-molecular-weight polydiols such as ethylene glycol, diethylene glycol, triethylene glycol, 1,2-propanediol, 1,3-propanediol, 1,3-butanediol, 1,4-butanediol, neopentyl glycol, pentanediol, 3-methyl-1,5-pentanediol, and 1,6-hexanediol; high-molecular-weight polyol compounds such as polytetramethylene glycol, polyethylene glycol, and polypropylene glycol; and the like. Among these, from the viewpoint of the compatibility with the other components in the mixing step, bifunctional and trifunctional polypropylene glycols (herein, the trifunctional polypropylene glycol means polypropylene glycol having a branch obtained by using as a polymerization initiator glycerin having multiple functional groups) and polytetramethylene glycol are preferable; polypropylene glycol and/or polytetramethylene glycol having a number average molecular weight (Mn) of approximately 500 to 5000 are more preferable; polypropylene glycol having a Mn of approximately 2000 to 4000 and/or polytetramethylene glycol having a Mn of approximately 500 to 1500 are further preferable; and polypropylene glycol having a Mn of approximately 3000 and/or polytetramethylene glycol having a Mn of approximately 1000 are most preferable. Moreover, the polypropylene glycol is preferably trifunctional polypropylene glycol.

The second polyol compounds (C-2) may be used alone, or multiple polyol compounds (C-2) may be used in combination.

In the case where the second polyol compound (C-2) is used, The materials are preferably provided such that an equivalence ratio of amino groups of the polyamine compound (D), which will be described below, to a sum of equivalents of the amino groups of the polyamine compound and hydroxyl groups of the second polyol compound (C-2) (the equivalent of active hydrogen groups) (hereinafter may be called s value) is 0.70 to 0.97 (the amino groups/(the amino groups+the hydroxyl groups)).

The second polyol compounds (C-2) may be used alone, or multiple polyol compounds may be used in combination.

[(D) Polyamine Compound]

In Description and Claims, the polyamine compound means a compound having two or more amino groups in its molecule.

The polyamine compound (D) (hereinafter, may be called component (D)) acts as a chain extender so that part can react with the polyisocyanate compound to form a hard segment, while other part can be bonded to terminals of main chains of the polyurethane bond-containing isocyanate compound (soft segment portion) to further extend the polymer chain. Thereby, a polyurethane-polyurea resin having a block copolymer of the hard segment and the soft segment is formed.

As the polyamine compound (D), aliphatic or aromatic polyamine compounds, particularly diamine compounds, can be used. Examples thereof include ethylenediamine, propylenediamine, hexamethylenediamine, isophoronediamine, dicyclohexylmethane-4,4'-diamine, 3,3'-dichloro-4,4'-diaminodiphenylmethane (methylene-bis-o-chloroaniline) (hereinafter, abbreviated as MOCA), polyamine compounds having a similar structure to that of MOCA, and the like. Moreover, the polyamine compound may have a hydroxyl group. Examples of such an amine-based compound include 2-hydroxyethylethylenediamine, 2-hydroxyethylpropylenediamine, di-2-hydroxyethylethylenediamine, di-2-hydroxyethylpropylenediamine, 2-hydroxypropylethylenediamine, di-2-hydroxypropylethylenediamine, and the like.

The polyamine compound is preferably a diamine compound, more preferably MOCA, diaminodiphenylmethane, and diaminodiphenylsulfone, and particularly preferably MOCA.

Here, as MOCA, solid MOCA and crude MOCA are known. The solid MOCA means monomer of MOCA in a solid form at room temperature. The crude MOCA is a mixture of monomer of MOCA and multimers of MOCA, and one having a ratio of the multimers of 15 mass % or more is preferably used. The ratio of the multimers is more preferably 10 to 50 mass %, further preferably 20 to 40 mass %. Examples of the multimers include dimers, trimers, and tetramers of MOCA, and the like. Crude MOCA is easy to control the reaction rate; as a result, is easy to obtain a molded body having uniform physical properties (for example, density, hardness, and so forth) as a whole.

In Description and Claims, when the "solid MOCA" and "crude MOCA" are used, these respectively mean the above-described solid MOCA and crude MOCA.

The polyamine compounds (D) may be used alone, or multiple polyamine compounds may be used in combination. Moreover, since the solid MOCA and the crude MOCA are solids at normal temperature, in a case where they are each used in the mixing step, the MOCA has to be heated to approximately 120° C. to be in a molten state. For this reason, in the case where the second polyol compound (C-2) is used, the MOCA, particularly crude MOCA, is preferably dissolved into the second polyol compound (C-2) in advance for use because the resultant can be utilized in the mixing step without heating to the melting temperature and suppresses uneven polymerization attributable to the reactivity increased by the heating. When the MOCA is dissolved in the second polyol compound (C-2) for use as described above, a mass ratio between the MOCA and the second polyol compound (C-2) is preferably 3:1 to 1:3, more preferably 2:1 to 1:2, and particularly preferably 1:1. Moreover, the second polyol compound (C-2) for dissolving the MOCA is preferably polytetramethylene glycol, more preferably polytetramethylene glycol having a number average molecular weight (Mn) of approximately 500 to 5000, further preferably polytetramethylene glycol having a Mn of approximately 500 to 1500, and most preferably polytetramethylene glycol having a Mn of approximately 1000.

The polyamine compound (D) is preferably degassed under reduced pressure while being heated, if necessary, in order to facilitate the mixing with the other components and/or to improve the uniformity of the cell diameter in the subsequent molded-body molding step. As the degassing method under reduced pressure, known methods for producing polyurethane polyurea may be employed. For example, the degassing can be performed using a vacuum pump at a degree of vacuum of 0.1 MPa or less.

In the case where a solid compound is used as the chain extender, the compound may be degassed under reduced pressure while being melted by heating.

On the other hand, in the case where a liquid polyamine compound at room temperature is used, the degassing may be performed under reduced pressure without heating.

In the method for producing a polishing pad of the present invention, a content ratio (molar ratio or equivalence ratio) of the polyamine compound to the polyol compound used for forming the prepolymer and/or all the polyol compounds is much lower than a content ratio employed for producing conventional polishing pads.

Specifically, in the case where the solid MOCA is used as the polyamine compound, the solid MOCA is preferably used in a quantity of 200 to 250 parts by mass relative to 1000 parts by mass of the total of the polyisocyanate compound and the first polyol compound (C-1). In a case where liquid MOCA (the details will be described later) is used as the polyamine compound, the liquid MOCA is preferably used in a quantity of 380 to 650 parts by mass relative to 1000 parts by mass of the total of the polyisocyanate compound (A) and the first polyol compound (C-1).

[(E) Hollow Microspheres]

In the method for producing a polishing pad of the present invention, the hollow microspheres (H) (hereinafter, may be called component (E)) is used to embed cells inside the polyurethane-polyurea resin molded body.

The hollow microsphere refers to the one obtained by expanding by heat an unexpanded, thermally expandable microsphere including an outer shell (polymer shell) made of a thermoplastic resin and a low-boiling-point hydrocarbon embedded in the outer shell.

As the polymer shell, it is possible to use, for example, thermoplastic resins such as an acrylonitrile-vinylidene chloride copolymer, an acrylonitrile-methyl methacrylate copolymer, and a vinyl chloride-ethylene copolymer as disclosed in Japanese Patent Application Publication No. Sho 57-137323 and so forth. Similarly, as the low-boiling-point hydrocarbon embedded in the polymer shell, it is possible to use, for example, isobutane, pentane, isopentane, petroleum ether, and the like.

Specific examples include product names: EXPANCEL461DE (manufactured by Expancel) (particle diameter: 20 to 40 μm) and EXPANCEL551DE (manufactured by Expancel) (particle diameter: 30 to 50 μm), which include a polymer shell portion made of an acrylonitrile-vinylidene chloride copolymer and an isobutane gas embedded in the shell.

The use of the hollow microspheres increases the ratio of closed cells. This suppresses permeation of a slurry and a sludge into the pad, and a scratch due to aggregation and solidification of the abrasive grains and the sludge can be prevented from occurring.

The particle diameter of the hollow microsphere (E) is not particularly limited, but is preferably adjusted in order that the polyurethane-polyurea resin molded body of the polishing pad has an average cell diameter of preferably 10 to 50 μm, more preferably 20 to 40 μm.

Moreover, the hollow microspheres (E) are preferably added in a quantity of approximately 1 to 10 mass %, preferably 2 to 4 mass %, relative to all the components constituting the polyurethane-polyurea resin (i.e., 100 mass % of the total of the components (A) to (D)).

If the amount of the hollow microspheres (E) is less than the above-described range, the hardness tends to be increased. In contrast, if the hollow microspheres (E) are excessively added more than the above-described range, the spheres adhere to each other and are ruptured, and open cells are likely to be formed. Hence, the ratio of closed cells is lowered.

Further, as long as the effects of the present invention are not impaired, a conventionally-used blowing agent may be used, besides the above components, in combination with the hollow microspheres, and a gas non-reactive to each component may be introduced to be introduced during the mixing step described below. The blowing agent includes water and blowing agents mainly containing a hydrocarbon having 5 or 6 carbons. Examples of the hydrocarbon include linear hydrocarbons such as n-pentane and n-hexane; and alicyclic hydrocarbons such as cyclopentane and cyclohexane.

Furthermore, known foam stabilizers, flame retardants, colorants, plasticizers, and the like may be added in addition to the above-described components.

<Mixing Step>

In the mixing step, the polyurethane bond-containing isocyanate compound (prepolymer) (A), the polyamine compound (D), and the hollow microspheres (E) (and, if necessary, the polyol compound (C-2)) obtained in the providing step and prepolymer forming step are supplied into a mixer, and stirred and mixed. Here, it is preferable that the polyurethane bond-containing isocyanate compound (A) and the hollow microspheres (E) be mixed at first, and this resultant is supplied into the mixer together with the polyamine compound (D), and as necessary the second polyol compound (C-2) and the like. In this manner, a liquid mixture for molded-body molding is prepared. The mixing step is performed while the temperature is increased so that the flowability of each of the components can be secured.

For example, to a prepolymer (isocyanate) solution containing the hollow microspheres and heated to 30° C. to 100° C., the solid MOCA (120° C.) or the MOCA (80° C.) dissolved in the polyol compound (C-2) may be added into a temperature-adjustable mixer with a jacket, and the mixture may be stirred at 80° C. As necessary, the liquid mixture may be transferred to a tank with an agitator and a jacket, and aged. The stirring period is adjusted as appropriate, depending on the number of blades, the number of revolutions, clearance, and the like of the mixer, and is for example 0.5 to 600 seconds.

<Molded-Body Molding Step>

In the molded-body molding step, a polyurethane-polyurea resin molded body is molded by pouring the liquid mixture for molded-body molding prepared in the mixing step into a mold at 50 to 100° C. to thereby cure the liquid mixture. Here, the prepolymer and the polyamine compound (and the polyol compound) react with each other to form the polyurethane-polyurea resin. Thereby, the liquid mixture is cured, while the hollow microspheres are substantially uniformly dispersed in the resin. Accordingly, the polyurethane-polyurea resin molded body is formed, which uniformly contains a large number of micro-cells of a substantially spherical shape as shown in FIG. 1.

Note that the sectional photograph in FIG. 1 is a photograph of a cross section of a polishing pad of the present Example 3, and taken at ×100 magnification. The white bar at a lower portion in the figure represents a length of 100 μm.

<Polishing-Layer Forming Step>

The polyurethane-polyurea resin molded body obtained in the molded-body molding step is sliced to a sheet shape. Thus, a polyurethane polyurea sheet is formed. By the slicing, opened pores are provided on the sheet surface. Here, to form opened pores on the surface of a polishing layer, which is excellent in wear resistance and is hardly clogged, aging is performed at 30 to 80° C. for approximately 1 hour to 2 weeks, so that a desired elasticity is easily obtained. Here, it is preferable to make the average cell diameter in the molded body within the above-described range, that is, 10 to 50 μm, preferably 20 to 40 μm. As necessary, by controlling the prepolymer temperature (viscosity), the number of revolutions of the stirring, the air flow rate, the type and concentration of the foam stabilizer, the mold temperature, and so on, the average cell diameter can be made within the above-described range.

Then, a double-faced adhesive tape is adhered to a surface of the polishing layer having the polyurethane polyurea sheet obtained as described above, the surface being on a side opposite to the polishing surface of the polishing layer. The resultant is cut to a predetermined shape, preferably disc shape, and thus the polishing pad of the present invention is completed. The double-faced adhesive tape is not particularly limited, and any double-faced adhesive tape can be selected for use among double-faced adhesive tapes known in this technical field.

Moreover, the polishing pad of the present invention may have a single-layer structure including only the polishing layer, or may have multiple layers including another layer (underlayer, support layer) adhering to the surface of the polishing layer on the side opposite to the polishing surface. The properties of the other layer are not particularly limited, but it is preferable that a layer harder (having a higher A hardness) than the polishing layer be pasted to the surface on the opposite side of the polishing surface of the polishing layer. Providing the layer harder than the polishing layer makes it possible to prevent fine recesses or protrusions of a polishing platen from influencing the shape of the polishing surface, and further improves the polishing flatness. Moreover, the rigidity of a polishing cloth is increased as a whole, and thereby occurrence of a fold or the like can be suppressed when the polishing cloth is adhered to the platen.

In the case of the multi-layer structure, it is only necessary that the multiple layers be adhered and fixed to each other using a double-faced adhesive tape, an adhesive, or the like, if necessary, by pressurizing. The double-faced adhesive tape and the adhesive used here are not particularly limited, and any double-faced adhesive tape and adhesive can be selected for use among double-faced adhesive tapes and adhesives known in this technical field.

Further, in the polishing pad of the present invention, as necessary, the front surface and/or a back surface of the polishing layer may be ground, or the front surface may be grooved or embossed. A base material and/or an adhesive layer may be pasted to the polishing layer, and a light-transmission portion may also be provided.

The grinding method is not particularly limited, and the grinding can be performed by known methods. Specifically, the grinding includes grinding with sandpaper.

The pattern by the grooving and the embossing is not particularly limited. Examples thereof include lattice-like, concentric, radial, and other patterns.

When the polishing pad of the present invention is used, the polishing pad is attached to a polishing platen of a polisher in such a manner that the polishing surface of the polishing layer faces a workpiece. Then, the polishing platen is rotated while an abrasive slurry is being supplied, and a work surface of the workpiece is polished.

The workpiece to be processed with the polishing pad of the present invention includes glass substrates for hard disks, mother glasses for flat panel displays, semiconductor wafers, semiconductor devices, and the like. Above all, the polishing pad of the present invention is suitably used for processing semiconductor devices.

<<Functions and Effects>>

The CMP polishing pad of the present invention has the polishing layer containing the polyurethane-polyurea resin molded body, and the polyurethane-polyurea resin molded body is set to have: a ratio of closed cells in a range of 60 to 98%; a storage modulus E' in a range of 1 to 100 MPa at 40° C. with an initial load of 10 g, a strain range of 0.01 to 4%, and a measurement frequency of 0.2 Hz in a tensile mode; tan δ in a range of 0.15 to 0.30; and a density D in a range of 0.4 to 0.8 g/cm³.

The polishing pad has a high ratio of closed cells. Accordingly, the retention of a slurry and a sludge is suppressed only on the polishing surface, and aggregation and solidification of the abrasive grains and the sludge hardly occur. Moreover, repetitive compressions during polishing prevent the slurry from reaching the inside, although the slurry continuously comes and goes. Thus, the cushioning effect is hardly lost. Further, in conventional hard pads of closed-cell type, even a small amount of aggregation and solidification of abrasive grains and a sludge may cause a scratch in some cases because of the hardness; meanwhile, since the present invention is soft and has a relatively high tan δ, the elasticity is delayed. This suppresses excessive pressing and excessive following to recesses or protrusions of a workpiece. As a result, a scratch hardly occurs, and the polishing rate is also improved. Furthermore, the polishing pad of the present invention is excellent also in polishing uniformity. These effects can be further improved when the $T2_M$, $C_M$, and/or X value in pulsed NMR are within the above-described ranges.

Meanwhile, the polishing pad of the present invention is provided with opened pores having a shape obtained by slicing the cells of a substantially spherical shape. Moreover, the polishing pad has an isotropic molded structure uniform in a thickness direction and a plane direction of the polishing layer. The polishing pad of the present invention has a different pore (opened pore) shape on the surface of the polishing layer from that of a conventional polishing pad (abbreviated as soft (wet) polishing pad) molded by the wet method and having an anisotropic foam structure having relatively large suede-type opening portions. The soft (wet) polishing pad has a structure in which the cell diameter gradually increases from the polishing surface toward the bottom portion. For this reason, as wearing progresses by polishing, this increases the cell diameter (opened-pore diameter) on the surface, so that the surface becomes rough, bringing about a problem that the polished quality is deteriorated. Moreover, the structure, in which the cells increase in size toward the bottom portion, has another problem that the surface is torn apart and worn due to polishing resistance. In contrast, the polishing pad of the present invention is molded by the dry method, and the cells are isotropic. Accordingly, the polishing pad of the present invention also has such an effect that the problems of the wet polishing pad hardly occur.

EXAMPLES

Hereinafter, the present invention will be described in more details based on Examples. However, the present invention is not limited to these Examples.

In Examples, Comparative Examples, and Tables 1 and 2, "parts" mean "parts by mass", unless otherwise specifically stated. Note that a value of EXPANCEL551DE indicates mass % relative to the total solid content, that is, 100 mass % of the total of the component (B), the component (C-1), (the component (C-2)), and the component (D).

Moreover, abbreviations in Tables 1 and 2 mean the followings.

2,4-TDI: 2,4-tolylene diisocyanate
Hydrogenated MDI: 4,4'-methylene-bis(cyclohexyl isocyanate)
PTMG1000: polytetramethylene glycol having a number average molecular weight of approximately 1000
DEG: diethylene glycol
MOCA: 3,3'-dichloro-4,4'-diaminodiphenylmethane
Trifunctional PPG3000: trifunctional polypropylene glycol having a number average molecular weight of 3000

Moreover, the NCO equivalent (PP) is a numerical value indicating a molecular weight of PP (prepolymer) per NCO group, and obtained by "((parts by) mass of a polyisocyanate compound+(parts by) mass of a polyol compound (C-1))/ [(the number of functional groups per molecule of the polyisocyanate compound×(parts by) mass of the polyisocyanate compound/the molecular weight of the polyisocyanate compound)−(the number of functional groups per molecule of the polyol compound (C-1)×(parts by) mass of the polyol compound (C-1)/the molecular weight of the polyol compound (C-1))]"

The s value is, as described above, a numerical value indicating an equivalence ratio of amino groups of a polyamine compound (D) to a sum of equivalents of the amino groups (D) of the polyamine compound and hydroxyl groups of a second polyol compound (C-2) (the equivalent of active hydrogen groups) (the amino groups/(the amino groups+the hydroxyl groups)).

Note that liquid MOCA used in Examples and Comparative Examples below is a liquid mixture of PTMG1000 and crude MOCA (multimer content of 40 mass %) in a mass ratio of 1:1 (hereinafter, stated as liquid MOCA).

Comparative Example 1

In Comparative Example 1, a conventionally-known hard (dry) polishing pad was produced. As a first-component prepolymer, used was an isocyanate group-containing urethane prepolymer having an isocyanate content of 9.0% and an NCO equivalent of 466, which was obtained by reacting 316 parts of 2,4-TDI, 88 parts of hydrogenated MDI, and 539 parts of PTMG having a number average molecular weight of approximately 1000, and then adding 57 parts of diethylene glycol thereto for further reaction. The prepolymer was heated to 55° C., and degassed under reduced pressure. As a second-component chain extender, solid MOCA was melted at 120° C., and degassed under reduced pressure. Moreover, 24 parts of hollow microspheres (EXPANCEL551DE) were mixed with the first component such that the hollow microspheres were 2 mass % relative to the total solid content, that is, 100 mass % of the total of the component (B), the component (C-1), and the component (D). The first component: the second component were supplied to a mixer in such a ratio that the weight ratio was 1024 parts:256 parts.

The obtained liquid mixture was poured into a 890×890-mm mold heated to 50° C. After heating at 100° C. for 5 hours for curing, a polyurethane resin molded body thus formed was taken out of the mold. Further, the molded body was sliced to a thickness of 1.25 mm to prepare a urethane sheet. Thus, a polishing pad was obtained.

Example 1

In Example 1, as a first-component prepolymer, used was an isocyanate-urethane prepolymer having an isocyanate content of 7.8% and an NCO equivalent of 540, which was obtained by reacting 2,4-TDI (286 parts) and PTMG having a number average molecular weight of approximately 1000 (714 parts). To the prepolymer, 51 parts of hollow microspheres (EXPANCEL 551 DE) were added and mixed such that the hollow microspheres were 4 mass % relative to the total solid content, that is, 100 mass % of the total of the component (B), the component (C-1), the component (C-2), and the component (D). The mixture was heated to 55° C., and degassed under reduced pressure. As a second-component chain extender, solid MOCA (220 parts) was used, which was melted at 120° C., and degassed under reduced pressure. As a third component, 50 parts of trifunctional PPG was used, and degassed under reduced pressure. The first component:the second component:the third component were supplied to a mixer in such a ratio that the weight ratio was 1051 parts:220 parts:50 parts. The obtained liquid mixture was poured into a 890×890-mm mold heated to 50° C. After heating at 100° C. for 5 hours for curing, a resin foam thus formed was taken out of the mold. Further, the foam was sliced to a thickness of 1.34 mm to prepare a urethane sheet. Thus, a polishing pad was obtained.

Examples 2 and 3 and Comparative Examples 1 to 4

Various polishing pads were produced by the same method as in Example 1, except that a proportion of the hollow microspheres was changed as shown in Table 1.

Example 4

In Example 4, as a first-component prepolymer, used was an isocyanate group-containing urethane prepolymer having an isocyanate content of 10.0% and an NCO equivalent of 420, which was obtained by reacting 2,4-TDI (325 parts) and PTMG having a number average molecular weight of approximately 1000 (675 parts). To the prepolymer, 65 parts of hollow microspheres (EXPANCEL 551 DE) were added and mixed such that the hollow microspheres were 4 mass % relative to the total solid content, that is, 100 mass % of the total of the component (B), the component (C-1), the component (C-2), and the component (D). The mixture was heated to 55° C., and degassed under reduced pressure. As a second-component chain extender, liquid MOCA (590 parts) was degassed under reduced pressure. As a third component, 42 parts of trifunctional PPG was used, and degassed under reduced pressure. The first component:the second component:the third component were supplied to a mixer in such a ratio that the weight ratio was 1065 parts: 590 parts: 42 parts. The obtained liquid mixture was poured into a 890×890-mm mold heated to 50° C. After heating at 100° C. for 5 hours for curing, a resin molded body thus formed was taken out of the mold. Further, the molded body was sliced to a thickness of 1.31 mm to prepare a urethane sheet. Thus, a polishing pad was obtained.

Examples 5 to 9 and Comparative Examples 5 to 7

Various polishing pads were produced by the same method as in Example 4, except that the proportion of each component was changed as shown in Table 2.

TABLE 1

| | Components | Comp. Ex. 1 | Comp. Ex. 2 | Ex. 1 | Ex. 2 | Ex. 3 | Comp. Ex. 3 | Comp. Ex. 4 |
|---|---|---|---|---|---|---|---|---|
| (B) | 2,4-TDI (parts) | 316 | 286 | 286 | 286 | 286 | 286 | 286 |
| | hydrogenated MDI (parts) | 88 | | | | | | |
| (C-1) | PTMG1000 (parts) | 539 | 714 | 714 | 714 | 714 | 714 | 714 |
| | DEG (parts) | 57 | | | | | | |
| (C-2) | trifunctional PPG3000 (parts) | | 50 | 50 | 50 | 50 | 50 | 50 |
| (D) | liquid MOCA (parts) | | | | | | | |
| | solid MOCA (parts) | 256 | 220 | 220 | 220 | 220 | 220 | 220 |
| (E) | EXPANCEL551DE (mass %) | 2 | 5 | 4 | 3 | 2 | 1 | 0 |
| | NCO equivalent (PP) | 466 | 540 | 540 | 540 | 540 | 540 | 540 |
| | s value | 1.00 | 0.97 | 0.97 | 0.97 | 0.97 | 0.97 | 0.97 |
| Physical properties | ratio of closed cells (volume %) | 98 | 55 | 85 | 94 | 98 | 99 | 0 |
| | E' 40° C. | 296 | 27 | 52 | 81 | 98 | 231 | 414 |
| | tanδ 40° C. | 0.08 | 0.19 | 0.19 | 0.19 | 0.19 | 0.19 | 0.19 |
| | density D (g/cm$^3$) | 0.80 | 0.28 | 0.45 | 0.63 | 0.80 | 0.98 | 1.15 |
| | T2$_M$ (40° C.) (μs) | 113 | 198 | 198 | 198 | 198 | 198 | 198 |
| | C$_M$ (40° C.) (%) | 43 | 64 | 64 | 64 | 64 | 64 | 64 |
| | X value | 141 | 721 | 441 | 317 | 248 | 203 | 172 |
| | average cell diameter (μm) | 33 | 33 | 33 | 33 | 33 | 33 | 33 |
| | hardness A (°) | 80 | 19 | 37 | 55 | 69 | 90 | 108 |
| | thickness (mm) | 1.25 | 1.33 | 1.34 | 1.33 | 1.33 | 1.30 | 1.33 |
| Polishing test | polishing rate nm/min | 185 | 214 | 203 | 219 | 231 | 178 | 45 |
| | | (D) | (A) | (B) | (A) | (A) | (D) | (D) |
| | polishing uniformity CV % | 8.1 | 11.2 | 7.6 | 4.6 | 4.8 | 6.0 | 12.0 |
| | | (D) | (D) | (C) | (A) | (A) | (B) | (D) |
| | the number of substrates with scratch (among 5 substrates) | 5 | 1 | 0 | 0 | 0 | 2 | 5 |
| | | (D) | (D) | (B) | (B) | (B) | (D) | (D) |

TABLE 2

| | Components | Comp. Ex. 5 | Comp. Ex. 6 | Ex. 4 | Ex. 5 | Ex. 6 | Ex. 7 | Ex. 8 | Ex. 9 | Comp. Ex. 7 |
|---|---|---|---|---|---|---|---|---|---|---|
| (B) | 2,4-TDI (parts) hydrogenated MDI (parts) | 367 | 344 | 325 | 310 | 297 | 286 | 276 | 268 | 257 |
| (C-1) | PTMG1000 (parts) DEG (parts) | 634 | 656 | 675 | 690 | 703 | 714 | 724 | 732 | 743 |
| (C-2) | trifunctional PPG3000 (parts) | 42 | 42 | 42 | 42 | 42 | 42 | 42 | 42 | 42 |
| (D) | liquid MOCA (parts) solid MOCA (parts) | 740 | 660 | 590 | 540 | 490 | 450 | 420 | 390 | 350 |
| (E) | EXPANCEL551DE (mass %) | 4 | 4 | 4 | 4 | 4 | 4 | 4 | 4 | 4 |
| | NCO equivalent (PP) | 340 | 380 | 420 | 460 | 500 | 540 | 580 | 620 | 680 |
| | s value | 0.71 | 0.71 | 0.71 | 0.71 | 0.71 | 0.71 | 0.71 | 0.70 | 0.70 |
| Physical properties | ratio of closed cells (volume %) | 95 | 94 | 96 | 94 | 93 | 96 | 95 | 97 | 92 |
| | E' 40° C. | 184 | 91 | 55 | 35 | 24 | 16 | 9 | 4 | 3 |
| | tan δ 40° C. | 0.09 | 0.14 | 0.17 | 0.19 | 0.20 | 0.22 | 0.23 | 0.25 | 0.31 |
| | density D (g/cm$^3$) | 0.54 | 0.54 | 0.54 | 0.54 | 0.54 | 0.54 | 0.54 | 0.54 | 0.54 |
| | $T2_M$ (40° C.) (μs) | 175 | 200 | 220 | 240 | 256 | 272 | 286 | 299 | 315 |
| | $C_M$ (40° C.) (%) | 58 | 64 | 69 | 74 | 78 | 82 | 86 | 89 | 93 |
| | X value | 326 | 372 | 410 | 447 | 477 | 505 | 533 | 556 | 507 |
| | average cell diameter (μm) | 33 | 33 | 33 | 33 | 33 | 33 | 33 | 33 | 33 |
| | hardness A (°) | 48 | 46 | 44 | 42 | 40 | 39 | 38 | 37 | 35 |
| | thickness (mm) | 1.29 | 1.33 | 1.31 | 1.29 | 1.33 | 1.34 | 1.29 | 1.33 | 1.31 |
| Polishing test | polishing rate nm/min | 179 (D) | 183 (D) | 217 (A) | 234 (A) | 238 (A) | 243 (A) | 229 (A) | 231 (A) | 241 (A) |
| | polishing uniformity CV % | 4.5 (A) | 4.2 (A) | 4.5 (A) | 4.4 (A) | 4.8 (A) | 5.2 (B) | 5.5 (B) | 6.7 (B) | 7.6 (C) |
| | the number of substrates with scratch (among 5 substrates) | 3 (D) | 3 (D) | 0 (B) | 0 (B) | 0 (B) | 0 (B) | 0 (B) | 0 (B) | 1 (D) |

<Evaluation of Physical Properties>

For each of Examples and Comparative Examples described above, the ratio of closed cells (%), storage modulus E'$_{40}$ (Mpa) tan δ, density (g/cm$^3$) $T2_M$ (μs), $C_M$ (%), X value, average cell diameter (μm), A hardness (°), and thickness (mm) of the urethane sheet were calculated or measured. Tables 1 and 2 show the results.

Note that the methods for measuring the items are as follows.

(Ratio of Closed Cells)

As to the ratio of closed cells (%), the ratio of closed cells was measured according to ASTM D2856 using a dry automatic density meter Accupyc 1330 (manufactured by Shimadzu Corporation). The used measurement sample was prepared by cutting the urethane sheet described in Comparative Examples and Examples to a square 25 mm on each side, and stacking a number of such sheets to a thickness of approximately 25 mm.

Note that the specific equation for the ratio of closed cells is as follows.

$$\text{Ratio of closed cells} = (Vx - W/\rho) \times 100 / (Va - W/\rho)(\%)$$

Vx: sum (cm$^3$) of the volume of the closed cells and the volume of the resin, which were measured using the dry automatic density meter Va: apparent volume (cm$^3$) of the molded body, which was calculated from the external dimensions of the molded body W: weight (g) of the molded body ρ: density (g/cm$^3$) of the resin constituting the molded body (Storage Modulus E'$_{40}$ and Tan δ)

As the storage modulus at 40° C. (E'$_{40}$ (MPa)), the storage modulus E' was measured using TA Instruments Japan Inc. RSAIII with an initial load of 10 g, a strain range of 0.01 to 4%, and a measurement frequency of 0.2 Hz at 40° C. according to JIS K7244-4. Moreover, tan δ was calculated from data on the storage modulus E' and the loss modulus E" obtained by the measurement.

(Density D)

The density D (g/cm$^3$) was calculated by measuring the weight (g) of a specimen having been cut to a predetermined size, and then finding the volume (cm$^3$) from the size.

($T2_M$ and $C_M$)

As to the pulsed NMR measurement, a 1-cm diameter glass tube was loaded with specimens cut to approximately 1- to 2-mm square to a height of 1 to 2 cm, and the relaxing behavior (free induction decay signal) was measured by a solid echo method using a pulsed NMR spectrometer (manufactured by JEOL Ltd., JNM-MU25, 25 MHz) with a 90° pulse of 2.0 μs, repetition time: 4 s, number of scans: 8, and a temperature: 40° C. The obtained decay curve was resolved by a least-squares method into components of an amorphous phase, an interface phase, and a crystalline phase in descending order of T2 (spin-spin relaxation time), and values of $T2_M$ and $C_M$ were obtained.

(Average Cell Diameter)

As to the average cell diameter (μm), an area of approximately 1.3-mm square on the pad surface was observed using a microscope (VH-6300, manufactured by KEYENCE CORPORATION) at 175-fold magnification, and the number of cells was counted by binarizing the obtained image using image processing software (Image Analyzer V20LAB Ver. 1.3, manufactured by Nikon Corporation) to calculate equivalent circle diameters and the average value (average cell diameter) from the area of each cell. Note that the cutoff value (lower limit) of the cell diameter was set to 10 μm to exclude noise components.

(A Hardness)

The A hardness was measured according to Japanese Industrial Standards (JIS K 7311) using a Shore A durometer. Note that a specimen was prepared by stacking on each other four urethane sheets (each having a thickness of approximately 1.3 mm) described in each of Comparative Examples and Examples such that the total thickness was set to at least 4.5 mm or more.

<Polishing Test>

The polishing pad of each of Examples and Comparative Examples was used for polishing under the following polishing conditions to measure the polishing rate, the polishing uniformity, and the presence or absence of a scratch. As a workpiece, a substrate (uniformity (CV %) of 13%) was used, which was prepared by forming tetraethoxysilane on a 12-inch silicon wafer by CVD such that the insulating film had a thickness of 1 μm.

(Polishing Rate)

The polishing rate represents a polished amount per minute by thickness (nm). An average value was obtained from the thickness measurement result at 17 sites of the insulating film on each substrate before and after the polishing. Note that, in the thickness measurement, a DBS mode of an optical film-thickness metrological measurement system (manufactured by KLA-Tencor Corporation, ASET-F5x) was selected for the measurement.

(Polishing Uniformity)

The polishing uniformity was obtained from a variation (standard deviation/average value) of the thickness measurement result at the 17 sites.

(Presence or Absence of Scratch)

In the scratch evaluation, 25 substrates were polished repeatedly three times in sequence. Five substrates, that is, the 21st to 25th substrates after the polishing were measured with an unpatterned wafer surface inspection system (manufactured by KLA-Tencor Corporation, Surfscan SP1DLS) in a high-sensitivity measurement mode to evaluate the presence or absence of a scratch on the substrate surface.

Note that the polishing conditions employed in the test are as follows.

Used polisher: manufactured by Ebara Corporation, F-REX300.
Number of revolutions: (platen) 70 rpm, (top ring) 71 rpm.
Polishing pressure: 220 hPa.
Abrasive: manufactured by Cabot Microelectronics Corporation, product number: SS25 (a liquid mixture of SS25 stock solution:pure water=1:1 was used).
Abrasive temperature: 30° C.
Amount of abrasive discharged: 200 ml/min.
Used workpiece (workpiece): a substrate prepared by forming tetraethoxysilane on a 12-inch ϕ silicon wafer by CVD such that the insulating film had a thickness of 1 μm.
Polishing period: 60 seconds/each time.
Dressing: (after the polishing cloth was pasted) 10 min.

Tables 1 and 2 show the results of the polishing test conducted on each of Examples and Comparative Examples by employing the above-described methods.

Here, since the polishing pad of the present invention is required to demonstrate the polishing rate, the polishing uniformity, and the scratch suppression in a proper balance as the effects, the polishing test results were evaluated in consideration of the product quality as follows.

The polishing rate was evaluated as A if 210 or more (nm/min); B, 200 or more but less than 210 (nm/min); C, 190 or more but less than 200 (nm/min); D, less than 190 (nm/min).

The polishing uniformity was evaluated as A if 5.0 or less (CV %); B, more than 5.0 but 7.0 or less (CV %); C, more than 7.0 but 8.0 or less (CV %); D, more than 8.0 (CV %).

The presence or absence of a scratch was evaluated as B if none (0 substrates); D, if any (one or more substrates).

Then, among the three items of the polishing rate, the polishing uniformity, and the presence or absence of a scratch, samples with no D and zero or one C (all the three items are A or B; or, two items among the three items are A or B, and one item is C) were evaluated as preferable examples (Examples), while as samples having two or more Cs and samples having even one D were evaluated as non-preferable examples (Comparative Examples) in the present invention.

Test Result 1

Comparative Example 1

The conventional polishing pad produced in Comparative Example 1 had a low tan δ, and the storage modulus and the density were both high. Moreover, all of $T2_M$, $C_M$, and X value were small, and the Shore A hardness was high. Accordingly, the pad was a hard polishing pad with less strain deformation. As a result, scratches occurred, and no satisfactory numerical values were obtained in polishing rate and polishing uniformity, either.

Test Result 2

Examples 1 to 3 and Comparative Examples 2 to 4

In Examples 1 to 3 and Comparative Examples 2 to 4, in which the solid MOCA was used as the chain extender, the amounts of the components (B), (C-1), (C-2), and (D) were the same, but the amount of the component (E) was varied. As a result, if the amount of the component (E) was large, the ratio of open cells was increased, the ratio of closed cells and the density became too low, a scratch occurred, and no sufficient result was obtained in polishing uniformity, either (Comparative Example 2). In contrast, if the amount of the component (E) was small, the storage modulus and the density became high, the resin portion was increased, the hardness became too high, scratches occurred, and the result of polishing rate was also poor (Comparative Examples 3, 4).

On the other hand, in the polishing pads produced by adjusting the amount of the component (E) to have all of the ratio of closed cells, the storage modulus, the tan δ, and the density within the scope of the present invention, no scratch occurred, and favorable results were obtained in both of the polishing rate and the polishing uniformity, as well (Examples 1 to 3).

Test Result 3

Examples 4 to 9 and Comparative Examples 5 to 7

In Examples 4 to 9 and Comparative Examples 5 to 7, in which the liquid MOCA was used as the chain extender, in contrast to the above, the amount of the component (E) was the same, but the amounts of the other components were varied. As a result, if the proportions of the component (B) and the component (D) were too high, the tan δ became low, and the storage modulus E' was also increased. Accordingly, although the density and the hardness were within the optimal ranges, the polishing pads lacked a delayed elasticity, scratches occurred, and no sufficient result was obtained in polishing rate (Comparative Examples 5, 6). In contrast, if the proportions of the component (B) and component (D) were too low, all of tan δ, $T2_M$, $C_M$, and X value were excessively increased. Accordingly, although the density and the hardness were within the optimal ranges, a scratch occurred, and the result of polishing uniformity was also poor (Comparative Example 7).

On the other hand, in the polishing pads produced by adjusting the amount of each component to have all of the ratio of closed cells, the storage modulus, the tan δ, and the density within the scope of the present invention, no scratch occurred, and favorable results were obtained in both of the polishing rate and the polishing uniformity, as well (Examples 4 to 9).

As apparent from the above, no scratch occurred on the polished surface of the workpiece, and favorable results were also obtained in polishing rate and polishing uniformity in the polishing pads of Examples 1 to 9 having: a ratio of closed cells in a range of 60 to 98%; a storage modulus E' in a range of 1 to 100 MPa at 40° C. with an initial load of 10 g, a strain range of 0.01 to 4%, and a measurement frequency of 0.2 Hz in a tensile mode; tan δ in a range of 0.15 to 0.3; and a density D in a range of 0.40 to 0.80 g/cm³. This revealed that all of the scratch suppression, the polishing rate and the polishing uniformity were demonstrated in a proper balance as the effects in comparison with Comparative Examples 1 to 7.

INDUSTRIAL APPLICABILITY

Although the polishing pad of the present invention is a soft pad with a low storage modulus, the proportion of closed cells is high. This suppresses permeation of a slurry and a sludge into the pad, and a scratch due to aggregation and solidification of the abrasive grains and the sludge hardly occurs. Moreover, since the tan δ is relatively high, the polishing pad has a delayed elasticity appropriately. This suppresses excessive pressing and excessive following to recesses or protrusions of a workpiece. As a result, a scratch hardly occurs, and the polishing rate is also improved. Furthermore, the polishing pad of the present invention is excellent also in polishing uniformity. Thus, despite being molded by the dry method, the polishing pad is advantageously usable for primary processing as well as finish processing. Accordingly, the polishing pad of the present invention and the method for producing the same have industrial applicability.

The invention claimed is:

1. A polishing pad for polishing a semiconductor device, the polishing pad comprising a polishing layer having a polyurethane-polyurea resin molded body containing cells of a substantially spherical shape, wherein
   the polyurethane-polyurea resin molded body has a ratio of closed cells of 60 to 98%,
   the polyurethane-polyurea resin molded body has a ratio tan δ of a loss modulus E" to a storage modulus E' (loss modulus/storage modulus) of 0.15 to 0.30 at 40° C. with an initial load of 10 g, a strain range of 0.01 to 4%, and a measurement frequency of 0.2 Hz in a tensile mode,
   the storage modulus E' is 1 to 100 MPa, and
   the polyurethane-polyurea resin molded body has a density D of 0.4 to 0.8 g/cm³.

2. The polishing pad according to claim 1, wherein, provided that a free induction decay signal (FID) of the polyurethane-polyurea resin molded body obtained by pulsed NMR is subjected to waveform separation by sequentially subtracting components in descending order of spin-spin relaxation time T2 based on a least-squares method, and thus divided into three components of L (amorphous phase), M (interface phase), and S (crystalline phase) in descending order of spin-spin relaxation time T2, the M component has spin-spin relaxation time $T2_M$ of 180 to 300 μs.

3. The polishing pad according to claim 2, wherein a component ratio $C_M$ of the M component present in the polyurethane-polyurea resin molded body is within a range of 60 to 90 mass %.

4. The polishing pad according to claim 2, wherein an X value obtained by $X=T2_M/D$ is within a range of 210 to 580, wherein
   $T2_M$ represents the spin-spin relaxation time of the M component, and
   D represents the density.

5. The polishing pad according to claim 1, wherein the polyurethane-polyurea resin molded body has an average cell diameter of 10 to 50 μm.

6. The polishing pad according to claim 1, wherein the polyurethane-polyurea resin molded body has an A hardness of 20 to 70 degrees.

7. The polishing pad according to claim 1, wherein the polyurethane-polyurea resin molded body has a thickness of 0.5 to 1.5 mm.

8. The polishing pad according to claim 1, wherein a layer harder than the polishing layer is pasted to a surface of the polishing layer on a side opposite to a polishing surface thereof.

9. The polishing pad according to claim 1, wherein the cells are formed by hollow portions of hollow microspheres.

10. A method for producing the polishing pad according to claim 1, the method comprising:
    a providing step of providing at least a polyurethane bond-containing isocyanate compound (A), a polyamine compound (D), and hollow microspheres (E);
    a mixing step of mixing at least the polyurethane bond-containing isocyanate compound (A), the polyamine compound (D), and the hollow microspheres (E) to obtain a liquid mixture for molded-body molding;
    a molded-body molding step of molding a polyurethane-polyurea resin molded body from the liquid mixture for molded-body molding; and
    a polishing-layer forming step of forming a polishing layer having a polishing surface for polishing a workpiece from the polyurethane-polyurea resin molded body.

11. The method for producing the polishing pad according to claim 10, the method further comprising a step of reacting a polyisocyanate compound (B) with a first polyol compound (C-1) to obtain the polyurethane bond-containing isocyanate compound (A).

12. The method for producing the polishing pad according to claim 11, the method comprising:
    further providing a second polyol compound (C-2); and
    mixing the second polyol compound (C-2) with the polyurethane bond-containing isocyanate compound (A), the polyamine compound (D), and the hollow microspheres (E) in the mixing step.

13. The method for producing the polishing pad according to claim 12, wherein, in the providing step, the materials are provided such that an equivalence ratio of amino groups of the polyamine compound (D) to a sum of equivalents of the amino groups of the polyamine compound (D) and hydroxyl groups of the second polyol compound (C-2) (the equivalent of active hydrogen groups) is 0.70 to 0.97 (the amino groups/(the amino groups+the hydroxyl groups)).

14. The method for producing the polishing pad according to claim 10, wherein the polyamine compound (D) is
    methylene-bis-o-chloroaniline (MOCA), or
    crude MOCA that is a mixture of monomer and multimers of methylene-bis-o-chloroaniline (MOCA), wherein the crude MOCA contains the multimers in a quantity of 15 mass % or more.

15. The method for producing the polishing pad according to claim 12, wherein the second polyol compound (C-2) is polytetramethylene glycol or polypropylene glycol having a number average molecular weight of 500 to 5000, or a mixture thereof.

* * * * *